United States Patent
Mortensen et al.

(10) Patent No.: US 10,964,306 B2
(45) Date of Patent: Mar. 30, 2021

(54) SYSTEMS AND METHODS FOR NOISE CANCELING

(71) Applicant: ANALOG DEVICES, INC., Norwood, MA (US)

(72) Inventors: Mikael Mortensen, Cambridge, MA (US); Melissa Nolet, Wilmington, MA (US); Khiem Quang Nguyen, Tewksbury, MA (US)

(73) Assignee: ANALOG DEVICES, INC., Norwood, MA (US)

(*) Notice: Subject to any disclaimer, the term of this patent is extended or adjusted under 35 U.S.C. 154(b) by 490 days.

(21) Appl. No.: 14/911,239

(22) PCT Filed: Aug. 12, 2014

(86) PCT No.: PCT/US2014/050787
§ 371 (c)(1),
(2) Date: Feb. 9, 2016

(87) PCT Pub. No.: WO2015/023707
PCT Pub. Date: Feb. 19, 2015

(65) Prior Publication Data
US 2016/0196817 A1 Jul. 7, 2016

Related U.S. Application Data

(60) Provisional application No. 61/864,974, filed on Aug. 12, 2013.

(51) Int. Cl.
*G10K 11/178* (2006.01)
*H03M 1/00* (2006.01)

(52) U.S. Cl.
CPC .. *G10K 11/17855* (2018.01); *G10K 11/17823* (2018.01); *G10K 11/17853* (2018.01);
(Continued)

(58) Field of Classification Search
CPC ......... G10K 11/178; G10K 2210/1282; G10K 11/175; G10K 11/1784; H04R 2499/13; H04R 1/1083; H04R 2410/05
(Continued)

(56) References Cited

U.S. PATENT DOCUMENTS 4,840,448 A    6/1989  Thiennot
5,151,926 A *  9/1992  Chennakeshu ........ H03D 3/007
                                                    329/304
(Continued)

FOREIGN PATENT DOCUMENTS

CN    101257729    9/2008
CN    101803202    8/2010
(Continued)

OTHER PUBLICATIONS

Extended Search Report for European Patent Application Serial No. 15197323.7 dated Jun. 6, 2016.
(Continued)

*Primary Examiner* — Alexander Krzystan
(74) *Attorney, Agent, or Firm* — Patent Capital Group

(57) ABSTRACT

Active Noise Cancellation (ANC) systems and methods that reduce latency to improve performance. In certain embodiments the systems sample a noise signal using a sample period to create a stream of digital signal data that is representative of the noise signal. A data transport layer carries the digital signal data to a signal processor. The transport layer temporally organizes the digital signal data to place the digital signal data within an initial phase of a sample period. The remaining phase of the sample period is set to a duration that allows the signal processor to process the digital signal data carried in the initial phase and to output the processed data during the same sample period. In
(Continued)

this way, the processing of data occurs within one sample period and the latency is reduced and predictable.

20 Claims, 7 Drawing Sheets

(52) U.S. Cl.
CPC .. *G10K 11/17857* (2018.01); *G10K 11/17881* (2018.01); *G10K 11/17883* (2018.01); *H03M 1/001* (2013.01); *G10K 2210/1282* (2013.01); *G10K 2210/3053* (2013.01)

(58) Field of Classification Search
USPC ..................................... 381/71.4, 71.1, 71.8
See application file for complete search history.

(56) References Cited

U.S. PATENT DOCUMENTS

| | | | |
|---|---|---|---|
| 5,412,652 A | 5/1995 | Lu | |
| 5,485,523 A * | 1/1996 | Tamamura | G10K 11/1784 381/71.4 |
| 6,356,129 B1 * | 3/2002 | O'Brien | H03K 5/00006 327/156 |
| 6,611,537 B1 | 8/2003 | Edens et al. | |
| 7,365,669 B1 | 4/2008 | Melanson | |
| 7,818,457 B1 | 10/2010 | Flood et al. | |
| 2006/0245454 A1 | 11/2006 | Balasubramanian et al. | |
| 2007/0140503 A1 | 6/2007 | Sakamoto et al. | |
| 2009/0136052 A1 | 5/2009 | Hohlfeld et al. | |
| 2011/0116654 A1 | 5/2011 | Chan et al. | |
| 2012/0093342 A1 | 4/2012 | Rupprecht et al. | |
| 2012/0155666 A1 | 6/2012 | Nair | |
| 2012/0308022 A1 * | 12/2012 | Ookuri | G10K 11/178 381/71.1 |
| 2012/0316872 A1 | 12/2012 | Stoltz et al. | |
| 2013/0034237 A1 | 2/2013 | Olafsson et al. | |
| 2013/0194114 A1 | 8/2013 | Ritter et al. | |
| 2014/0025999 A1 * | 1/2014 | Kessler | G06F 13/4295 714/43 |
| 2014/0153732 A1 | 6/2014 | Fraisse et al. | |

FOREIGN PATENT DOCUMENTS

| | | |
|---|---|---|
| CN | 102195566 | 9/2011 |
| CN | 102332815 | 1/2012 |
| CN | 102648492 | 8/2012 |
| CN | 102867517 | 1/2013 |
| CN | 103227641 | 7/2013 |
| CN | 201280055576.7 | 6/2016 |
| JP | 2002-314552 | 10/2002 |
| JP | 2006138130 | 6/2006 |
| JP | 2008-278179 | 11/2008 |
| JP | 2010-065667 | 3/2010 |
| JP | 2011-211673 | 10/2011 |
| JP | 2012-049681 | 8/2012 |

OTHER PUBLICATIONS

Office Action issued in Chinese Patent Application Serial No. 20128005576.7 dated Dec. 3, 2015, 22 pages (including summary of relevance).
Summary of Relevance and Office Action in Japan Patent Application Serial No. 2015-162593 dated Oct. 4, 2016, 3 pages (including summary of relevance).
International Search Report and Written Opinion issued in PCT Patent Application Serial No. PCT/US2015/050787 dated Nov. 13, 2014, 8 pages.
Frenzel, Lou, *Fundamentals of Communications Access Technologies: FDMA, TDMA, CDMA, OFDMA and SDMA* retrieved from http://electronicdesign.com/communications/fundamentals-communications-access-technolo . . . , Feb. 5, 2016, 7 pages.
Office Action issued in CN Patent Application Serial No. 2014800044912.7 dated Aug. 31, 2018, 9 pages + [Explanation of Relevance, 1 page].
Google Translation of Foreign Reference CN101257729, 49 pages.
Office Action issued in DE Patent Application Serial No. 112014003723.0 dated Jun. 28, 2018 [English Translation, 3 pages].
Office Action issued in CN Patent Application Serial No. 2014800044912.7 dated Jul. 25, 2019, 5 pages + [Explanation of Relevance, 1 page].
English Translation of CN102332815 Abstract.
English Translation of CN102195566 Abstract.

* cited by examiner

SYSTEMS AND METHODS FOR NOISE CANCELING

CROSS REFERENCE TO RELATED APPLICATIONS

This application claims priority to and the benefit of U.S. provisional patent application Ser. No. 61/864,974 filed on Aug. 12, 2013, the disclosure of which is incorporated herein by reference in its entirety.

This disclosure relates to systems and methods that cancel or reduce noise, and more particularly, to systems and methods that reduce or cancel acoustic noise.

DESCRIPTION OF RELATED TECHNOLOGY

For systems that include, among other things, Active Noise Cancellation (ANC) the biggest challenge is often achieving low end-to-end system latency within the ANC system. Noise cancelation is most effective if the noise canceling signal is added simultaneously to the acoustic environment being monitored. ANC systems that delay the production of the noise cancelling signals have limited ability to respond to and cancel noise signals, and in particular the higher frequency components of the noise signals. Sometimes the delay in an ANC system arises from the environment in which it operates. For example, the interior cabin of a car or other moving vehicle can be a complex acoustic environment for an ANC system. Sound originates from multiple sources and the source of the noise may be a significant distance from the sound generator acting to cancel that noise. The physical distance between the noise source and the sound canceling generator creates a propagation delay that limits the rate at which a noise canceling signal can counteract the sound from the noise source. If the ANC system needs to propagate the noise cancelling system a meaningful distance in order to phase cancel a remote intermittent sound source, the distance between the noise canceling speaker and the person in the cabin adds an inherent delay to the noise canceling system. This delay sets an upper limit on the frequencies that the ANC system can cancel.

In addition to the environment, delay and latency can arise from the circuits processing the noise signals. For example, the compartment of a car may have several sources of noise, such as the engine, the wheel wells and the windows and may have several sensors and several noise canceling speakers located within the cabin. Even an average size cabin may have more than four microphones acting as sensors and more than seven noise canceling speakers. To work properly, the ANC system must process the noise cancellation signals to generate a specific noise correction signal to be generated at each of these speakers. These noise correction signals may be based on noise sensed from each of these sensors. Typically, this requires a FIR filter bank matrix having a size based on the number of sensors and the number of speakers. This can be a large and complex filter that needs to perform many calculations. These calculations must be performed in a fraction of a second in order to avoid adding latency due to processing delay.

To perform these calculations without adding extensive delay, the ANC systems have traditionally increased the sample rate of the system. Increasing the sample rate lowers the latency in a typical digital signal processing system, but it does so at the expense of increased power consumption, and an increase in required precision. Increased precision may require a larger number of coefficient bits. This increases requirements for memory, data path widths and performance. The end result is more area and cost and higher power consumption. For markets that cover headsets and cellphones both are important parameters.

Alternative approaches have attempted to have only part of the system run at a high rate. Typically, the analog-to-digital converter (ADC) is operated at a high sample rate. The ADC produces a high-throughput stream of digital data that a digital signal processor (DSP) can down sample to generate the noise cancelation signal. This method lowers the latency arising from the analog-to-digital conversion and lowers the MIPS required to generate the noise cancelation signal, but adds a source of group delay penalty from the down sampling. For example, one typical implementation of a down sampling circuit grabs every $n^{th}$-sample. This down sampling may be linear and may down sample by a factor of two or three. Thus, one sample is taken and next one or two samples are discarded. For the discarded samples, the system may estimate values through reconstruction based on the sampled values. However, discarding samples may introduce high-frequency sharp changes that need to be extracted to avoid folding down the noise. Typically, this requires the circuit to have a low pass filter, and this filter adds a group delay to the circuit.

Accordingly, there remains a need in the art for systems that reduce the deleterious effect of system latency in an ANC system.

SUMMARY

The systems and methods of this disclosure each have several innovative aspects, no single one of which is solely responsible for the desirable attributes disclosed herein.

In certain examples, the systems and methods described herein, include ANC systems that control latency by controlling delays through the elements of the ANC system. Typically, the ANC system includes an ADC, a transport layer, a digital filter, and DAC elements. These elements provide a signal chain, with each element performing part of the ANC process as the signal passes from element to element. The system produces a predictable delay which may be accounted for by a digital signal processing (DSP) function that implements the digital filter to generate the noise cancellation signal. In this way the deleterious effects of system latency in an ANC system are mitigated.

To this end, in one particular embodiment, the noise cancelation system includes an ADC to sample a noise signal at a set sample period and create a stream of digital data that represents the noise signal. The ADC may oversample the noise signal. A data transport layer carries the digital signal data to a signal processor. The transport layer temporally organizes the digital signal data by placing the digital signal data within an initial phase of a sample period. The remaining phase of the sample period is set to a duration that allows the signal processor to process the digital signal data carried in the initial phase and to output the processed data during the same sample period that was used to carry the digital data to the signal processor. In this embodiment, the signal processor acts as a digital filter that adds one sample delay to the production of the canceling acoustic signal. Further, this one added sample delay is predictable and may be accounted for by the signal processing algorithm executing within the signal processing filter.

In one embodiment, the noise cancellation system also includes a sequencing processor capable of arranging the processed signals in an output stream. Typically, the sequencing processor arranges the processed signals to have the digital transport layer carry selected processed signals to the digital to analog converters ahead of other processed signals. Optionally, the digital transport layer is capable of organizing the digital data in a sample period to have one or more contiguous processing phases. The processing phases have a duration set to be less than or equal to a time determined for the signal processor to generate the processed signals. In some embodiments, the one or more contiguous processing phases have a duration selected to support more than one noise cancellation system. In other implementations, the more than one contiguous processing sections have a duration selected to allow the generation of noise cancellation signals for noise signals from independent input sources and in other implementations the contiguous processing phases have a duration selected to allow the generation of noise cancellation signals generated by independent output sources for cancelling noise from one input source.

In certain embodiments, the digital transport layer extends between the analog to digital converters and the digital to analog converters. In certain embodiments, the digital transport layer includes a multi-channel digital audio transportation protocol layer, and in some embodiments that audio transportation protocol layer is any of I2S, A2B, TDM, parallel data, LVDS, SPDIF, SoundWire, BlueTooth, and byte level transport.

In certain embodiments the analog to digital converter includes a power control process for powering the analog to digital converter for a period of time that is less than the sample rate. The power control process may be a software process running on a microprocessor or DSP and having a control signal that activates the analog to digital converter.

Optionally, the noise cancellation system has a microphone pre-amplifier circuit coupled to the analog to digital converter and a speaker amplifier coupled to the digital to analog converter.

In some embodiments the signal processing filter start is skewed to lower the instructions per second (MIPS) required to generate the noise cancellation signals.

In another aspect, the systems and methods described herein include methods for noise cancellation, including oversampling an analog noise signal above a sample period to generate a stream of digital data, providing a digital transport layer for organizing the stream of digital data to place the digital data in an initial phase of the sample period, carrying the digital data to a signal processing filter capable of receiving the digital data carried in the initial phase of the sample period and generating processed signals during the sample period in which the digital data was received, and converting the processed signals to an analog form. Optionally, the methods sequence the processed signals in an output stream to have the digital transport layer carry selected processed signals to the digital to analog converters ahead of other processed signals. Further optionally, the methods power the analog to digital converters for a period of time that is less than the sample rate. Further optionally, the methods organize the digital data in a sample period to have one or more contiguous processing phases to provide a processing phase having a duration set to be less than or equal to a time determined for the signal processor to generate the processed signals.

In one embodiment, the system achieves a predictable "skewed Fs" by having each element in the signal chain generate a predictable "local Fs" that is delayed compared to the original source Fs, which may be the period of the clock rate for the circuit, thereby generating a signal having a predictable "skew". Normally the delay through a system is determined by the Fs, in that every element will have a delay measured in whole Fs, e.g. 1 Fs, 2 Fs, 3 Fs etc. By having a locally skewed Fs generated at each element in the signal chain, the delay through the element will be determined by the actual time it takes for the signal to pass the element and thus be independent of the actual Fs period and instead depends on the design of each element. In the digital domain, the DSP may account for a known delay by treating that delay as a known phase shift. By accounting for the known delay, this system may approach the delay through an analog filter, which is, in principle 0. For the systems and methods described herein, the delay through the digital domain is determined by the complexity of the filter and the actual processing/clock rate used in the system.

Optionally, the construction of the ADC and DAC may lower the delay through these conversion elements. Any suitable technique may used to reduce delay. In one example, a sigma delta ADC having an analog front end (AFE) converts the analog signal into a number of quantized values; these express the difference between the prior value and the current value. The AFE may run at an oversampled rate, e.g. 128×Fs, 64×Fs, 48×Fs, 24×Fs, or any suitable rate. The output of the AFE is the derived input signal. In the digital domain, this derived signal is converted into an actual value by integration and low pass filtering. The group delay of the filter is a function of quality and filter structure and can be anything for example, 2.5 to 11 Fs or even more. For certain ANC systems as noted herein, the actual frequency content of interest is within a low frequency band, and the target Fs may be 2 kHz, meaning the delay through a traditional ADC may be high.

The ANC systems described herein, in some embodiments, uses an oversampling sigma delta modulator operating at 512×Fs, where Fs is the sampling rate and in some embodiments may be 2 kHz. Oversampling, for the ANC systems described herein, is the operation of sampling the input noise signal at a frequency significantly greater than the Nyquist frequency (two times the input signal bandwidth). Oversampling decreases the quantization noise in the band of interest. The modulator output is decimated down to the target Fs rate using a fast decimation filter, which could be in one example embodiment a third order $SINC^{-1}$ filter bank. Decimation, for the ANC systems described herein, is the operation of reducing the data rate down from the oversampling rate without losing information, or substantial amounts of information. By starting the oversampling sigma delta modulator at an appropriate time before the end of the sample period and following it with a fast decimator, a system, even with a high quality digital filter, can achieve a lower delay through the ADC as the final delay will be determined by the decimator.

In one particular example system, the ANC system includes an analog to digital converter that converts acoustic signals into digital samples. The digital samples are transported by a transport layer, typically including a pair of clocked buffers, to a digital signal processor. The digital signal processor generates a digital signal that represents a phase shifted version of the digitized acoustic signal. The digital signal is transported by way of clocked buffers to a digital to analog converter that generates an acoustic signal that represents a phase shifted version of the acoustic signal and has a phase shift selected to cancel at least a portion of the acoustic signal being monitored by the ANC system. In one particular example, the portion of the acoustic signal being canceled is within the low-end frequencies of the acoustic signal and may for example be defined by a frequency band of below 500 Hz.

As will be described in more detail below, the analog to digital converter adds a predictable delay to the sampled acoustic signal. Similarly, the transport layer between the analog to digital converter and the digital signal processor add another predictable delay. The digital signal processor may add a selected delay to the sampled acoustic signal, and the transport layer and digital to analog converter can both add predictable sample delays. Given the predictability of the delay, the digital signal processor may add a phase shift selected to advance the cancelation signal by the predicted delay of the signal chain, and thereby control the phase of the acoustic cancellation signal being introduced into the acoustic environment being monitored.

Details of one or more implementations of the subject matter described in this disclosure are set forth in the accompanying drawings and the description below. Although the examples provided in this disclosure are primarily described in terms of ANC systems, the concepts provided herein may apply to other types of noise cancelation and audio processing. Other features, aspects, and advantages will become apparent from the description, the drawings and the claims.

DETAILED DESCRIPTION

The following description is directed to certain implementations for the purposes of describing the innovative aspects of this disclosure. However, a person having ordinary skill in the art will readily recognize that the teachings herein can be applied in a multitude of different ways. The described implementations may be implemented in any device, apparatus, or system that can be configured to monitor for acoustic noise. More particularly, it is contemplated that the described implementations may be included in or associated with a variety of electronic devices such as, but not limited to: stereos, mobile telephones, personal data assistants (PDAs), hand-held or portable computers, tablets, digital media players (such as MP3 players), camcorders, game consoles, DVD players, CD players, VCRs, and a variety of other devices. The teachings herein also can be used in other applications. Thus, the teachings are not intended to be limited to the implementations depicted solely in the Figures, but instead have wide applicability as will be readily apparent to one having ordinary skill in the art.

Figure 1A:
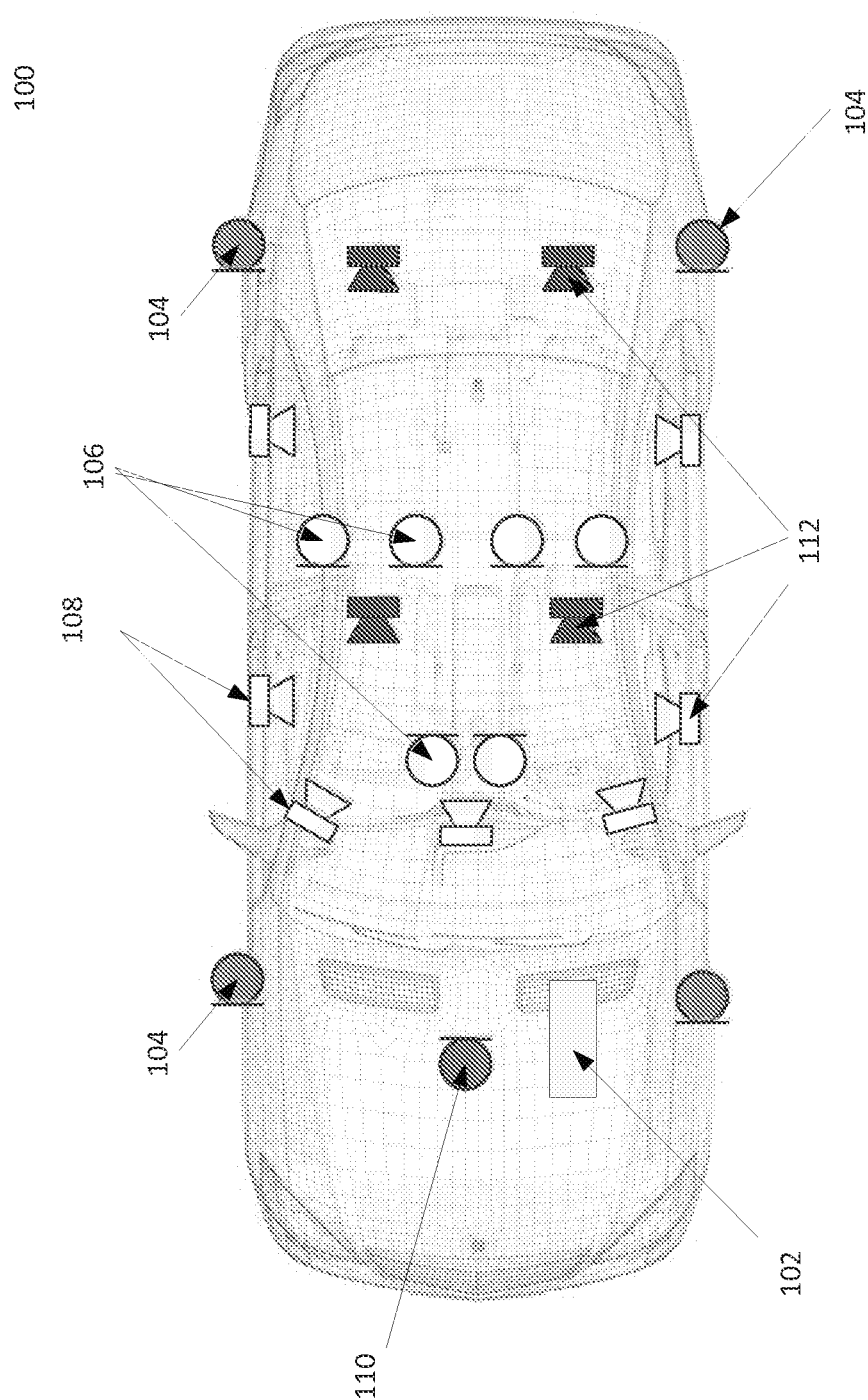
FIG. 1A is schematic view of an active noise cancellation system installed in the cabin of a car.

FIG. 1A is a schematic view an active noise cancellation system installed in the cabin of a car. In particular, FIG. 1A depicts an active noise cancellation system (ANC) 100 that includes a data processing system 102 and a set of sensors and noise cancelling generators situated within the cabin of a vehicle, which in this embodiment is the cabin of a car. The system 100 includes a plurality of different sensors. The sensors include cabin microphones 106, wheel well sensors 104, and an engine sensor 110. Also shown in FIG. 1A is that the noise cancelling system 100 includes a number of noise cancelling sound generators 112. The noise cancelling sound generators 112 are positioned within the interior of the cabin of the car and positioned so that they can counteract the effects of the noise sources that are generating noise in the interior environment of the cabin. In one implementation, the noise cancelling generators are acoustic sound generators, typically woofers that generate low-frequency acoustic signals as well as a series of mid-range and treble speakers capable of generating mid-range and high-frequency acoustic signals.

For the noise cancelling system 100 depicted in FIG. 1A the wheel well sensors 104 are positioned within the wheel well of the automobile and they sense noise being generated as the wheel rolls over the surface that the car is riding across. Acoustic signals arising from shocks and vibrations acting on the wheel are sensed by the wheel well sensor 104 and that information is employed by the signal processing system 102 to generate a counteracting signal that cancels or reduces the noise generated by the wheel moving across the surface of the road. Typically, the cancelling signal is a phase adjusted acoustic signal that acts to reduce the intensity of the noise generated within the wheel well. The other sensors include an engine sensor 110 which can be a microphone that collects the noise of the engine and provides that noise as a signal to the signal processor 102. In alternate implementations, the engine sensor 110 can be a sensor that generates data about certain operating characteristics of the engine, such as its revolutions per minute (rpm), and other information. That characteristic information may be provided to the signal processor 102 and employed within a software model executing within that signal processor 102 to generate a model of the sound which would be generated by an operating engine having the characteristics measured by the sensor 110.

Figure 1B:
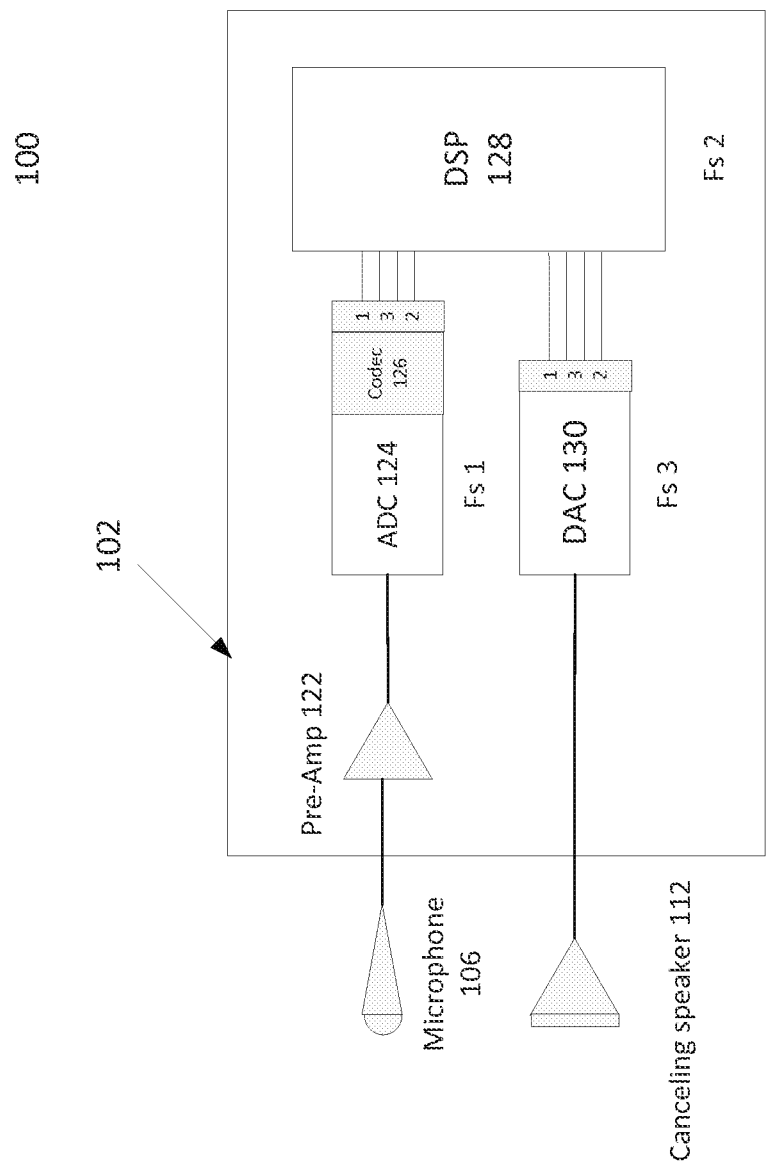
FIG. 1B is a system block diagram illustrating of a noise cancellation device as described herein.

FIG. 1B depicts one example of a noise cancellation system as described herein. In particular, FIG. 1B depicts a functional block diagram of one implementations of the noise cancellation system 100 depicted in FIG. 1A. microphone 106, a canceling speaker 112 and a signal processor 102. The signal processor 102 includes an optional pre-amplifier 122, an analog-to-digital-converter 124 having a codec, a digital signal processor 128, and a digital-to-analog-converter 130.

The noise cancelling system 100 can operate to sample acoustic signals by use of the microphone 106. The acoustic signals can pass through the optional pre-amplifier 122 that conditions the signal for processing by the analog-to-digital-converter 124. The analog-to-digital-converter 124 may be for example, a discreet ADC, and in one embodiment is the ADAU1977 manufactured and sold by the assignee hereof. Alternatively, the ADC may be an embedded ADC or any other suitable analog-to-digital-converter (ADC). The ADC may include or be coupled with an input amplifier. The input amplifier may be selected for different analog inputs, and may include a programmable gain amplifier (PGA), a microphone bias generator, a differential input amplifier, a single ended input amplifier, a pseudo differential input amplifier, a variable gain amplifier (VGA), a low noise amplifier (LNA). Any suitable type of amplifier may be employed including, but not being limited to, a Class A, Class B, Class AB, Class G, Class D, or Class H type amplifier. Optionally, the ADC can couple to an external mic amplifier and provide a line in for an audio signal. In the depicted embodiment, the ADC 124 includes a codec. The codec may, among other things, act as a clocked buffer that collects the digitally converted analog samples of the acoustic signal captured by microphone 106 and holds those digital signals for transport to the DSP 128. The connection between the ADC 124 and the DSP 128 can be affected by a transport layer. The transport layer may include the clocked buffers 132 that synchronously transfer digitized samples across a bus that extends from the ADC 124 to the DSP 128. The transport layer may be, in one implementation, a stream of bits, generated by the ADC 124 and encoded by the codec 126. The stream of bits is transferred over the bus from the ADC 124 to the DSP 128. The transport layer can have multiple channels, and transfer data from one ADC or from one microphone, on each respective channel. Multiple channels can be carried by the transport layer to the DSP 128. The buffer 132 is a clocked buffer that transfers the bits according to a clock cycle. A frame signal can frame the bits that are associated with a transfer period, which for this embodiment, is the sample period. The sample period is the period used to sample a noise signal for the purpose of capturing the data needed to generate a canceling signal. In one embodiment, the sample period is 2 KHz. In some embodiments, the digital transport layer is a multi-channel digital audio transportation protocol layer, and may be for example the I2S, A2B, TDM, parallel data, LVDS, SPDIF, SoundWire, BlueTooth, or byte level transport.

The DSP 128 may be a Sharc® processor manufactured by the assignee hereof. However, any suitable processor may be used including a fixed function filter, or a DSP that is capable of processing the digitized acoustic signal. In this application, which is noise cancelling, the DSP 128 will insert a delay representative of a phase shift selected to reduce or cancel noise within a particular frequency band of the acoustic signal captured by microphone 106. To that end, the DSP 128 includes a phase shift and transfers via a transport layer, the processed digital signal to the digital-to-analog-converter 130. Again as described above, a transport layer may exist between the DSP 128 and the DAC 130 that includes two or more clocked buffers, such as clocked buffer 132, that can synchronously transfer digital samples from the DSP 128 to the DAC 130. The DAC 130 converts the digital samples into an analog signal that may be broadcast through the cancelling speaker 112, to provide within the acoustic environment a noise cancelling signal. The DAC 130 may be any suitable DAC such as the ADAU1966 manufactured and sold by the assignee hereof.

Figure 1C:
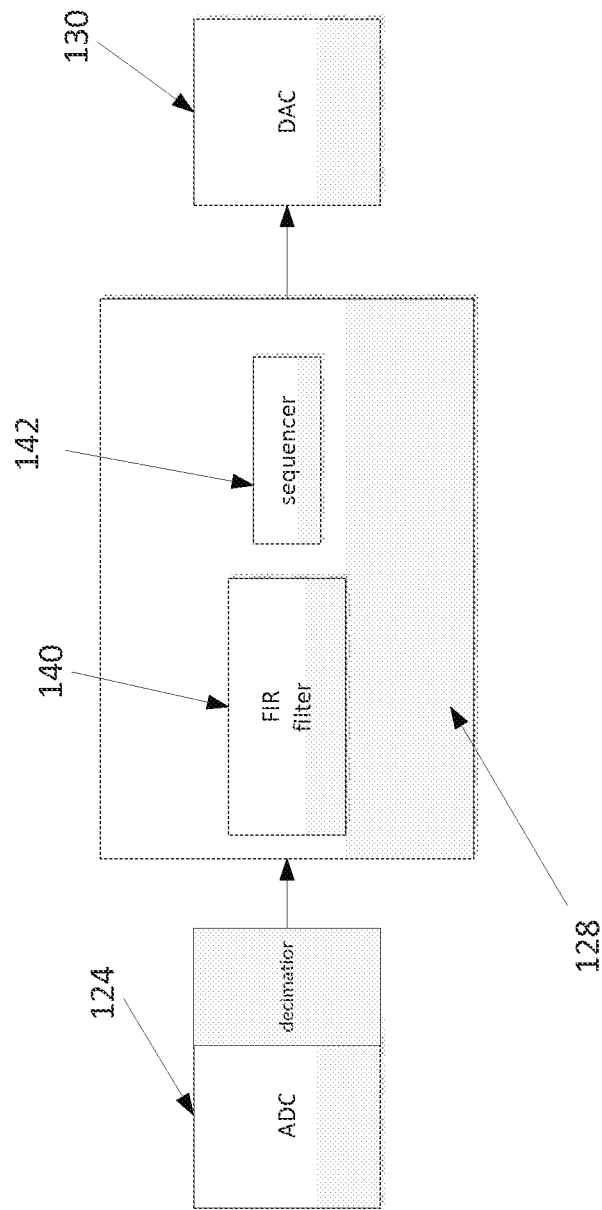
FIG. 1C is a block diagram of one embodiment of a Digital Signal Processor for use in the system of FIG. 1B.
Figure 2:
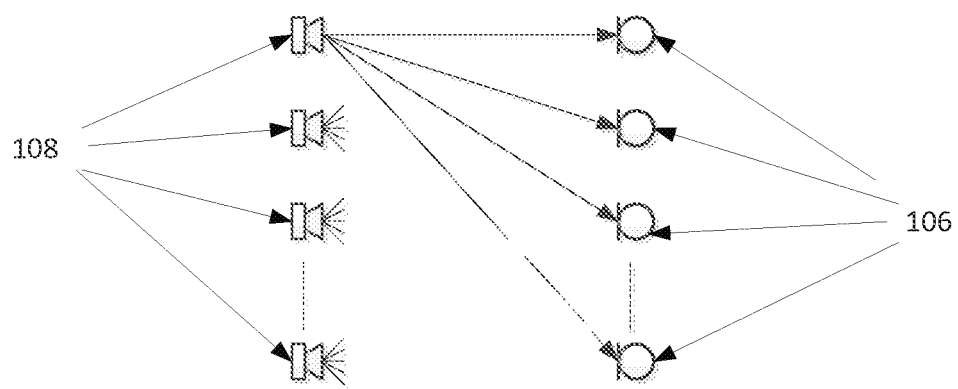
FIG. 2 depicts pictorially an example of the distance between noise cancelling speakers and noise sensors.

FIG. 1C illustrates as a block diagram one example of a DSP 128. The DSP 128, as noted above, may be Sharc® processor manufactured by the assignee hereof, and such a processor is a programmable device capable of carrying out mathematical operations that can be used to filter an incoming digital signal, as well a performing other logic operations, such as controlling the operation of the ADC 124, the DAC 130 or the clocked buffers 132. The DSP 128 can also receive signals from the ADC 124 and the DAC 130, such as interrupt signals that direct the DSP to interrupt current operations and being processing another program to attend to the interrupt condition. In the embodiment depicted in FIG. 1C, the DSP 128 includes a finite impulse response (FIR) filter 140 and a sequencer 142. Both may be instructions stored on the DSP 128 and capable of directing the operation of the DSP 128. The FIR filter 140 can be a filter capable of processing the incoming bitstream or bitstreams carried by the transport layer from the ADC 124 to the DSP 128. The FIR filter can process the incoming noise signals to generate the noise cancelling signal to be played through one or more of the speakers 112 within the cabin of the vehicle. The FIR filter can in some embodiments, be a filter matrix that generates signals to address the complex nature of the environment within the cabin of the vehicle. FIG. 2 depicts in part the complexity of that environment. As shown in FIG. 2 the four microphones 106 within the cabin can detect noise within the cabin. The four speakers 108 can generate noise canceling signals to reduce or eliminate noise within the cabinet. The FIR filter 140, in some embodiments, uses the noise detected from each microphone 106 (and optionally from the wheel well sensors and the engine sensor 110) to generate for each speaker 108 a signal to generate that, in the aggregate that is when combined with the signals from the other three speakers, will cancel noise heard by that respective microphone. The FIR filter 140 in some embodiments, will use a four (four microphones) by four (four speakers) FIR filer to generate noise cancelling signals that collectively are optimized to reduce noise at each speaker location in the cabin.

The FIR filter 140, in some embodiments, model the path from each speaker 108 to each microphone 106 to allow the removal of any desired signal before generating the noise cancelling signals. The FIR filter 140 can, in some embodiments, further contain and adaptive component that modifies the noise cancelling signals depending in other conditions such as, but not limited to, vehicle speed. The FIR filter 140, can, in some embodiments, modify the signal going to each speaker 108 to compensate for the speaker characteristics and the environment in which the speaker 108 is sitting.

The sequencer 142 may be a set of instructions executing on the DSP 124 capable of arranging data generated by the FIR filter 140 into data slots that are carried on the transport layer to the DAC 130. The sequencer can arrange the data in a preferred order, providing that data for certain speakers be ordered into the bitstream ahead of data for other speakers.

Figure 3:
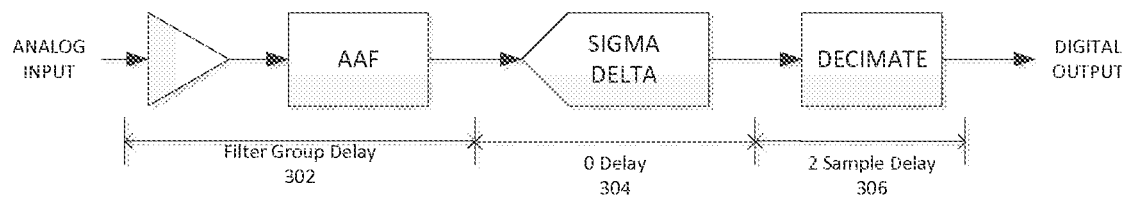
FIG. 3 depicts the delay of the ADC described herein.

The system depicted in FIG. 1C addresses issues of latency which can impact the effectivenss of the ANC. Latency can arise from the operation of the components that make up the ANC. For example, FIG. 3 depicts an example of the latency that may arise within the signal chain of the ADC, such as the ADC depicted in FIG. 4A. In particular, as shown in FIG. 3, the transmission of analog data through an amplifier or buffer and through the anti-aliasing filter (AAF) can cause a filter group delay 302. The delay caused by the AAF is implementation dependent, and the amount of delay incurred will depend at least in part on the design of the filter. The converter, in this case a sigma-delta converter, can add a delay 304, which in some cases is so small as not to impact the latency of the ADC. The decimator can add two sample delays before the digital output is delivered from the ADC, where a sample delay is a period of time equal or substantially equal to the sample period of the ANC. These latencies can arise from the normal operation of these components.

Figure 4A:
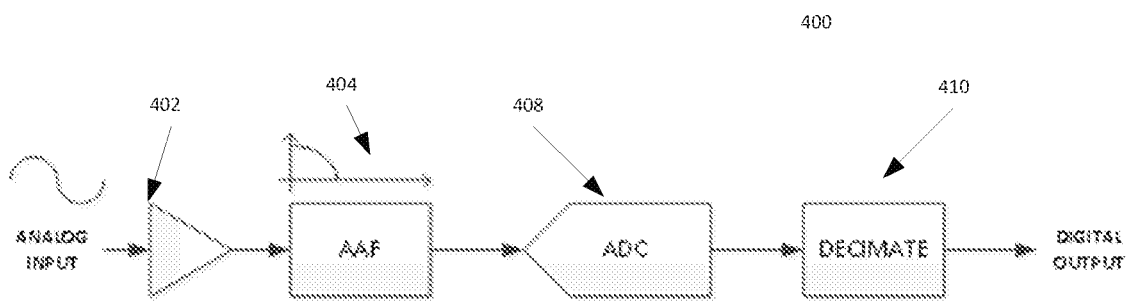
FIG. 4A depicts an example ADC of the type used in active noise cancellation system of FIG. 1.

FIG. 4A illustrates in more detail the example ADC circuit 400. Specifically, FIG. 4A shows and ADC circuit having an input buffer/holding circuit 402, an AAF 404, the converter (ADC) 408 and a decimation filter 410. The purpose of the AAF 404 is to band limit the input to the oversampling converter to avoid problems with folded products after the decimation. The ADC 408 in one embodiment is a sigma delta converter. The output of the ADC 408 is sampled at the oversampling rate, which typically is an integer multiple of the desired sample rate. In one example, the desired sample rate is 2 kHz. However, the sample rate may vary depending upon the application and may vary depending upon the characteristics of the noise signals being cancelled. The decimation filter 410 down-samples the oversampled output of the ADC 408 to the desired sample rate. In certain implementations, the ADC circuit 400 keeps the ADC running at the oversampling rate (the higher rate) and instead of generating continuous samples at this rate, the ADC circuit 400 will power up only for a period of time within the desired sample rate, such as the 2 Khz rate. The decimation filter 410 maybe a Sinc-1 filter, for example a three tap Sinc-1 filter. A three tap Sinc-1 filter will typically introduce a decimation delay of two samples, as compared to a traditional FIR which can be as much as twenty four samples.

In one example ADC, the oversampling ADC circuit 400 would operate at 6.144 MHz, which is equivalent to a 64× oversampling ADC for a 96 kHz sample rate. To improve the performance at the target sample rate of 2 kHz the oversampling ratio will be changed to 512, which provides an ADC delay of ~83 us. The function of the ADC circuit 400 is depicted in FIG. 4B.

Figure 4B:
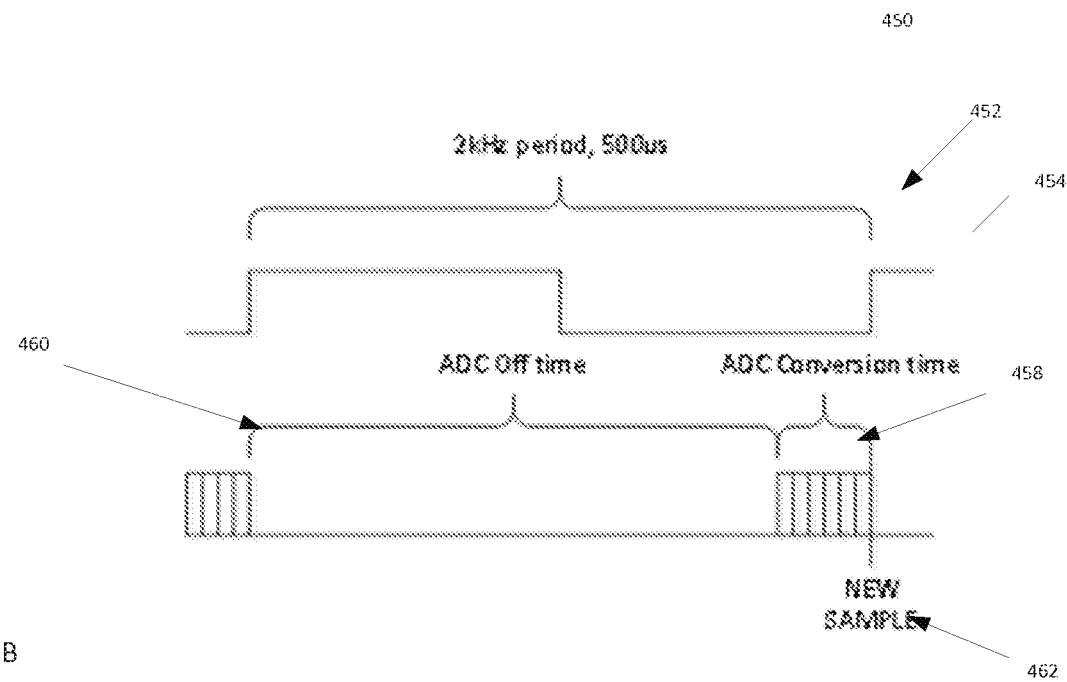
FIG. 4B depicts pictorially a sampling process for the ADC illustrated in FIG. 4A.

Specifically, FIG. 4B depicts an example of an ADC conversion 450 where the ADC actively converts the analog noise signal (not shown) by generating samples for a period of time 458 within the desired sample period 452. The ADC, or ADCs depending upon the embodiment, is driven by a convert-start signal. The convert-start signal may be generated by a signal processor, such as the signal processor 102 shown in FIG. 1B, or by any suitable component. The convert-start is timed to have the ADC begin taking samples at the high oversampling rate, only during a portion of the sample period. As illustrated, for the remainder 460 of the sample period the ADC will be off to conserve power. In the example above the ADC would on for ~⅙ the time and off for ~⅚ the time. The convert-start signal would direct the ADC to begin sampling only at after $5/6^{th}$ of the sample period 452 had passed. This lowers the front-end ADC power in the overall ANC system.

Figure 5:
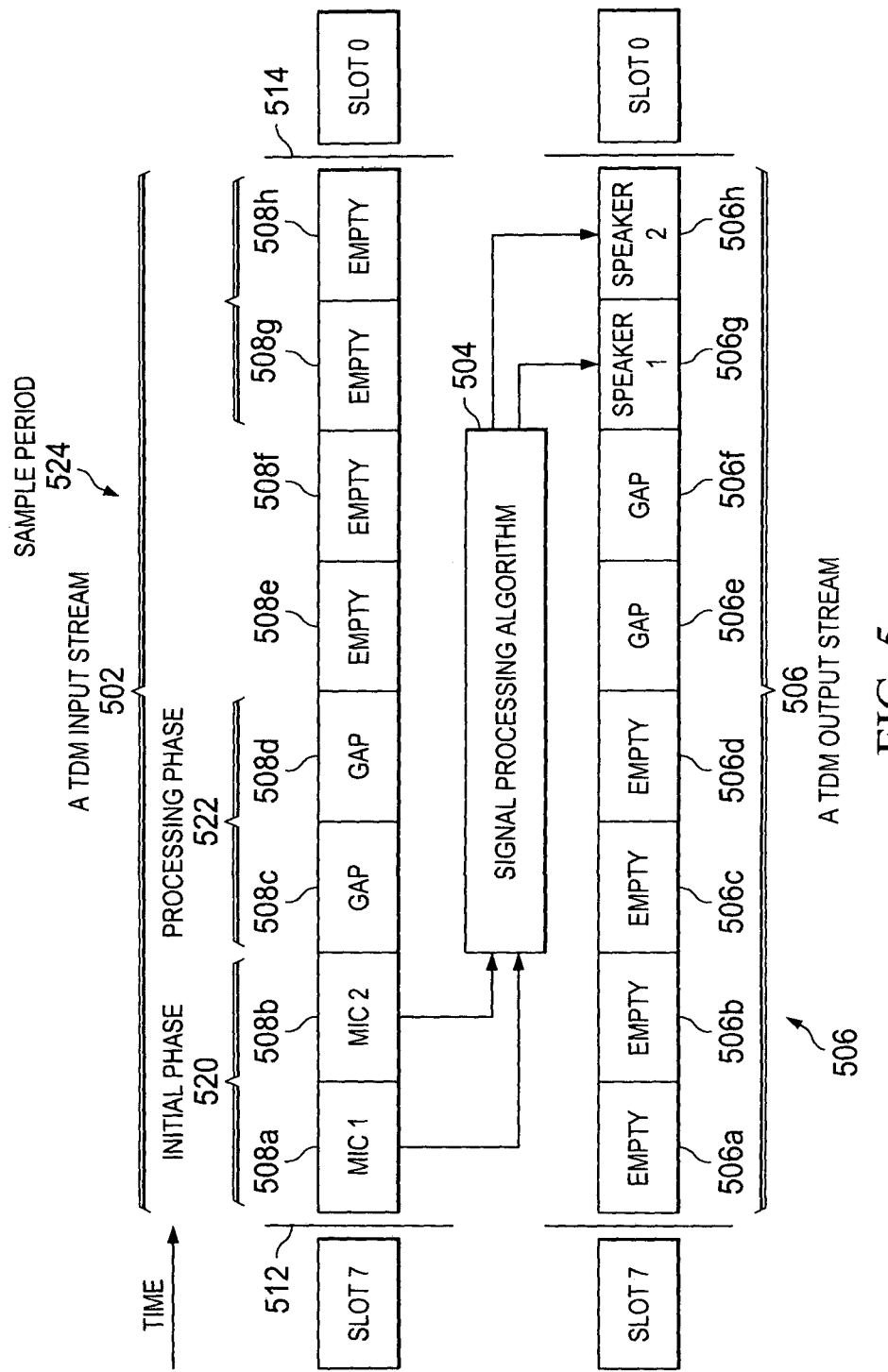
FIG. 5 depicts pictorially a method for the processing and arranging of data.

FIG. 5 depicts pictorially one embodiment of a method for processing and arranging data in one sample period of an acoustic noise cancelling process. In particular, FIG. 5 depicts an input stream 502 a signal processing algorithm 504 and an output stream 506. The input stream 502 is a series of bits transmitted as a stream. As described above with reference to FIGS. 1A through 1C, the stream of bits may be transferred by the transport layer that carries data as bits from the ADC to the DSP carrying out the signal processing function 504. In the method depicted in FIG. 5, the input stream is a time division multiplexed (TDM) bit stream. The bit stream includes eight data slots 508A through 508H. The eight data slots 508A through 508H are framed by a signal frame for 510. The signal frame 510 is demarked from other bits within the bit stream by the start mark 512 that demarks the start of the frame carrying data slots 508A through 508H, and the start mark 514 that indicates the start of a new frame carrying eight data slots related to a different frame. The eight data slots 508A through 508H occur within the data frame 510 and the data frame 510 can have a time period that is equivalent to the sample period of the acoustic noise cancellation system, for example, the sample period can be 2 KHz, or any other suitable sample period for an ANC system as described herein.

In the embodiment depicted in FIG. 5, the transport layer organizes the stream 502 of digital data from the ADC and places the digital data in an initial phase 520 of a sample period 524 so that the first two data slots 508A and 508B carry data from two microphones, microphone 1 and microphone 2. The data can be data generated by an ADC of the type depicted in FIG. 1B and it produces a data payload of some number of bits, for example, between 8 and 64 bits. The microphone data 508A can represent a sample taken of noise from microphone 1. Similarly, the data in 508B can represent a sample of noise sensed by microphone 2. Once the data frame 510 and the eight data slots are clocked into the DSP, the signal processing function 504 can begin. Pictorially this is illustrated in FIG. 5 by the lines connecting the data slots 508A and 508B to the signal processing function 504. The signal processing function 504 may be an FIR filter of the type described with reference to FIG. 1C. In any case, the signal processing function 504 processes the sampled data carried in the data slots 508A and 508B to generate a portion of the acoustic cancelling signal that will be delivered from a speaker, such as the speakers 108 depicted in FIG. 1A. The signal processing function 504 delivers the processed data to data slots 506a-506h within the output stream 506. In one embodiment, the signal processor is a Sharc® processor as described above and a Sharc® processor can have an operating clock of 400 megahertz. This allows the DSP to carry out the signal processing function at a speed capable of generating the output data for data slots 506G and data slot 506H before the end of the sample period 524. As such, FIG. 5 depicts that the microphone sensor data carried to the DSP in the early data slots 508A and 508B (the initial phase 520) can be processed by the signal processing function 504 and delivered to the output stream 506 before the end of the sample period 524, thus providing a signal processing function that incurs only one sample period delay, and reliably processes the data within one sample period. Graphically, the period of time allowed for the signal processing function 504 to be carried out by the DSP 124 is the processing phase 522 and is shown by the empty data slots 508C through 508F in the input data stream 502. These empty data slots of the processing phase 522 are contiguous and do not carry input data, or at least do not carry data needed to generate the cancelation signals, to the signal processing function 504 as the signal processing function 504 would not be able to produce the necessary output, such as the output 506G and 506H, prior to the end of the sample period.

Figure 6:
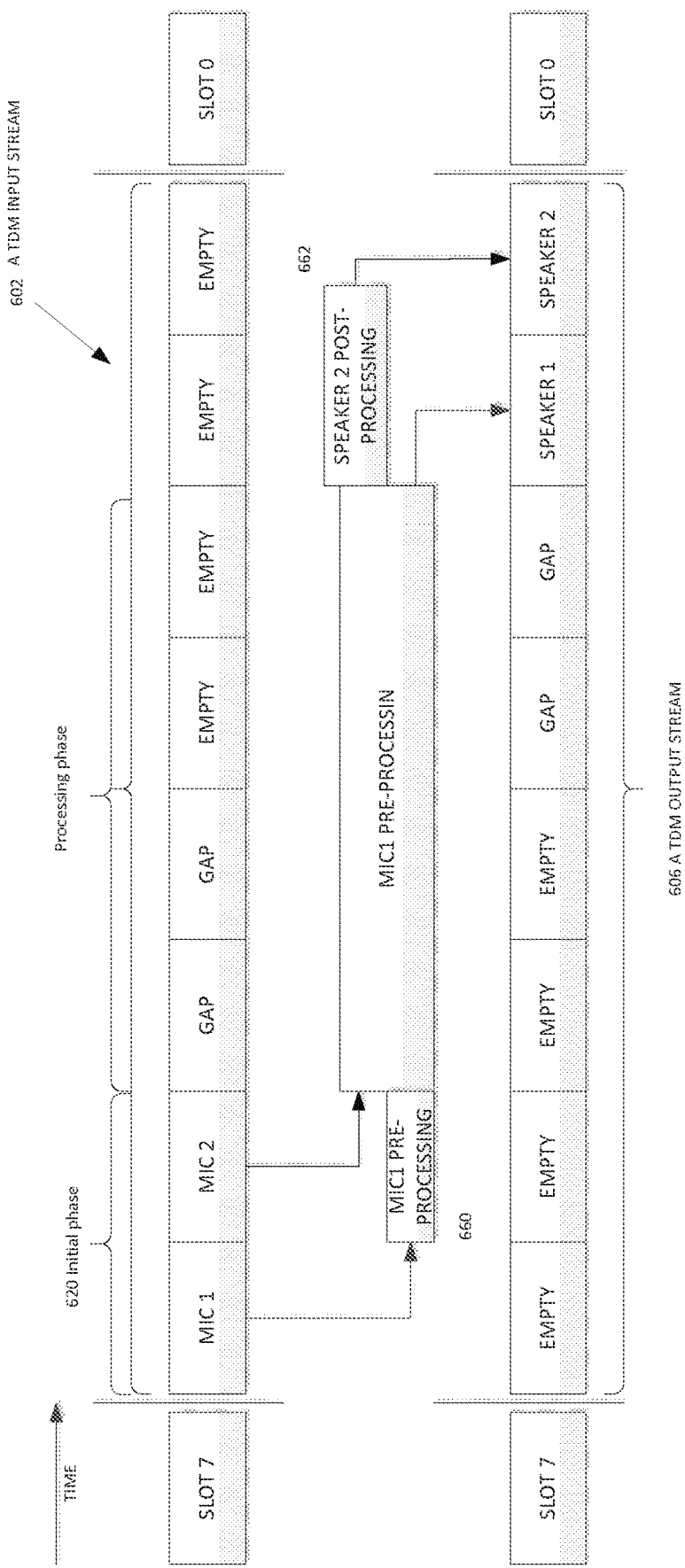
FIG. 6 depicts pictorially another embodiment of a method for processing and arranging data single sample period and arranging the sequence of the data in the output stream.

FIG. 6 depicts an alternate method for processing an input data stream. In particular, FIG. 6 depicts an input data stream 602 that carries data which can be processed by a signal processing method 604 to provide data to an output data stream 606. This method, like the method of FIG. 5, may sequence the output data in the output stream so that certain data is placed in certain data slots. Typically, this sequencing is in response to a sequencing processor, such as sequencer 142 in FIG. 1C, which can be a software process executing on the signal processor 128 or any microprocessor. The sequencing arranges the signals processed by the filter in the output stream 606 to have the digital transport layer carry selected processed signals to the digital to analog converters ahead of other processed signals. In the embodiment depicted in FIG. 6, the signal processing algorithm 604 includes two other processes 660 and 662. Process 660 can be a preprocessing function, such as for example a microphone preprocessing function that filters the microphone signal with a low pass filter to select from the acoustically sampled noise signal a portion of the frequency band of that noise signal. As depicted in FIG. 6, the preprocessing can occur for the data carried within data slot 608A. The processing of the data for microphone 1 carried in data slot 608A can occur during the time period that's aligned with the data slot 608B carrying acoustic data sampled from microphone 2. As the shock processor DSP is capable of operating at 400 MHz, the time period allotted for the data slot 608B is sufficiently long to allow for some preprocessing to take place of data that is earlier available within the bit stream. Similarly, the signal processing method 604 can include a second process 662 at the post end. In particular, the embodiment of FIG. 6 includes a post processing function 662 that is capable of using the time period needed for loading bit stream data into the data slot 606G to perform post processing operations on the data generated for speaker 2 and to be put into data slot 606H. Post processing functions can include filtering functions, that filter from the acoustically generated noise cancelling signal, side lobes or folded noise, or other artifacts that may arise from the processing that occurs in the signal processing method 604.

The various illustrative logics, logical blocks, modules, circuits and algorithm steps described in connection with the implementations disclosed herein may be implemented as electronic hardware, computer software, or combinations of both. The interchangeability of hardware and software has been described generally, in terms of functionality, and illustrated in the various illustrative components, blocks, modules, circuits and steps described above. Whether such functionality is implemented in hardware or software depends upon the particular application and design constraints imposed on the overall system.

The hardware and data processing apparatus used to implement the various illustrative logics, logical blocks, modules and circuits described in connection with the aspects disclosed herein may be implemented or performed with a general purpose single- or multi-chip processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, or, any conventional processor, controller, microcontroller, or state machine. A processor also may be implemented as a combination of computing devices, such as a combination of a DSP and a microprocessor, a plurality of microprocessors, one or more microprocessors in conjunction with a DSP core, or any other such configuration. In some implementations, particular steps and methods may be performed by circuitry that is specific to a given function.

Various modifications to the implementations described in this disclosure may be readily apparent to those skilled in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein.

The invention claimed is:

1. A low latency communication system, comprising:
a first processing circuit to:
receive an input frame of digital data, wherein the input frame includes a frame start signal followed by digital data arranged into time-divided data slots, the time-divided data slots include a last data slot and one or more other data slots, and the input frame of digital data is followed by another frame start signal indicating a start of another input frame,
perform a signal processing operation on the digital data in at least one other data slot to generate processed digital data, wherein the signal processing operation on the digital data in the at least one other data slot is initiated before the last data slot is received, and
transmit the processed digital data in an output frame of digital data, wherein the output frame includes a frame start signal followed by the processed digital data arranged into time-divided data slots, and the frame start signal of the output frame is transmitted before the last data slot is received.

2. The low latency communication system of claim 1, wherein transmission of the processed digital data in the output frame of digital data is completed before the another frame start signal is received.

3. The low latency communication system of claim 1, wherein the signal processing operation on the digital data in the at least one other data slot is completed before the last data slot is received.

4. The low latency communication system of claim 1, wherein the output frame is structured in accordance with I2S, A2B, SPDIF, Sound Wire, or Bluetooth.

5. The low latency communication system of claim 1, wherein the digital data includes a digital representation of a sample of an analog input signal.

6. The low latency communication system of claim 5, further comprising:
an analog to digital converter to sample the analog input signal and generate the digital representation, wherein the analog to digital converter is to generate digital representations of the analog input signal in regular time windows, and a duration of the time window is less than or equal to a duration of the input frame of digital data.

7. The low latency communication system of claim 6, wherein the duration of the time window is less than or equal to a duration of the output frame of digital data.

8. The low latency communication system of claim 6, further comprising:
a second processing circuit to:
receive the digital representation,
generate the input frame, wherein the digital data includes the digital representation, and the digital representation is included in an earliest data slot of the input frame, and
transmit the input frame to the first processing circuit.

9. The low latency communication system of claim 6, wherein the analog to digital converter is to generate digital representations of the analog input signal in the regular time windows by not sampling in an early portion of a time window and oversampling in a later portion of the time window.

10. The low latency communication system of claim 9, wherein the analog to digital converter is powered off during the early portion of the time window.

11. The low latency communication system of claim 5, wherein the digital data includes a plurality of digital representations of a corresponding plurality of samples of a corresponding plurality of analog input signals, and the plurality of digital representations is included in the earliest data slots of the input frame.

12. The low latency communication system of claim 1, wherein the digital data are representative of audio signals generated by one or more microphones, the processed digital data are representative of output signals to be provided to one or more speakers, and the signal processing operation includes phase-shifting the digital data for audio noise cancellation.

13. The low latency communication system of claim 12, further comprising the one or more microphones and the one or more speakers.

14. The low latency communication system of claim 1, further comprising:
   a digital to analog converter to generate an analog output signal from at least some of the processed digital data.

15. The low latency communication system of claim 1, wherein the low latency communication system is included in an audio noise cancellation system.

16. A method of minimizing delay in a time-division multiplexed communication system, comprising:
receiving a plurality of sequential sets of digital data;
generating a plurality of sequential data frames including corresponding ones of the plurality of sets of digital data, wherein each of the data frames begin with a frame start signal, and a set of digital data is distributed into one or more time-division multiplexed data slots of the corresponding data frame; and
transmitting the plurality of sequential data frames to a processing device, wherein the processing device is to begin digital signal processing on the digital data in one data frame before completing receipt of the data frame.

17. The method of claim 16, wherein the digital signal processing includes performing audio noise cancellation operations.

18. The method of claim 16, wherein the digital data includes digital representations of signals from a plurality of microphones in a vehicle.

19. The low latency communication system of claim 1, wherein the input frame is structured in accordance with I2S, A2B, SPDIF, SoundWire, or Bluetooth.

20. The low latency communication system of claim 1, wherein the frame start signal of the output frame is transmitted at a same time that the frame start signal of the input frame is received.

* * * * *